(12) United States Patent
Böttcher et al.

(10) Patent No.: US 6,867,610 B2
(45) Date of Patent: Mar. 15, 2005

(54) TEST STRUCTURE FOR DETERMINING THE STABILITY OF ELECTRONIC DEVICES COMPRISING CONNECTED SUBSTRATES

(75) Inventors: Mathias Böttcher, Dresden (DE); Thomas Werner, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/441,755

(22) Filed: May 20, 2003

(65) Prior Publication Data

US 2004/0100293 A1 May 27, 2004

(30) Foreign Application Priority Data

Nov. 27, 2002 (DE) .......................................... 102 55 378

(51) Int. Cl.[7] .............................................. G01R 31/02
(52) U.S. Cl. .................................... 324/754; 324/158.1
(58) Field of Search ........................ 324/754, 757–758, 324/761–762, 765, 158.1; 257/685–686, 723–725, 777–778

(56) References Cited

U.S. PATENT DOCUMENTS

| 5,477,160 A | * | 12/1995 | Love ........................... 324/755 |
| 6,133,744 A | * | 10/2000 | Yojima et al. ............... 324/754 |
| 6,466,038 B1 | | 10/2002 | Pekin et al. ................. 324/719 |
| 6,635,970 B2 | * | 10/2003 | Lasky et al. ................. 257/777 |

FOREIGN PATENT DOCUMENTS

| EP | 0 813 238 A2 | 12/1997 | ........... H01L/21/66 |
| JP | 10115657 A | 5/1998 | ........... G01R/31/26 |

OTHER PUBLICATIONS

Lozano et al., "Test Structures for MCM-D Technology Characterization," *IEEE Transactions on Semiconductor Manufacturing*, 12:184–92, 1999.
Zhang and Baldwin, "Reliability Assessment of Flip Chip on Organic Board Using Power Cycling Techniques," *2002 Electronic Components and Technology Conference*, pp. 962–967, 2002, no month.

* cited by examiner

*Primary Examiner*—Minh N. Tang
(74) *Attorney, Agent, or Firm*—Williams, Morgan & Amerson

(57) ABSTRACT

The present invention allows testing of bump connections under predefined conditions. To this end, a test structure including two substrates, each substrate having bond pads that are provided for flip-chip connecting both substrates. These bond pads may have electrical contact to other bond pads and/or special probe pads which are provided for making electrical connections to external devices. Electrically conductive bumps are formed on at least some of the bond pads of one of the substrates, and the bumps are electrically and mechanically connected to the bond pads in the other substrate.

9 Claims, 4 Drawing Sheets

TEST STRUCTURE FOR DETERMINING THE STABILITY OF ELECTRONIC DEVICES COMPRISING CONNECTED SUBSTRATES

BACKGROUND OF THE INVENTION

1. Field of the Invention

The present invention generally relates to the field of manufacturing of semiconductor devices, and, more particularly, to the packaging of integrated circuits, to stacked integrated circuits, to test structures for determining the stability of such devices with respect to electromigration and to a method for fabricating such test structures.

2. Description of the Related Art

Integrated circuits comprise a large number of individual circuit elements, such as transistors, capacitors and resistors. These elements are internally connected to form complex circuits like memory devices, logic devices and microprocessors. In particular, logic devices and microprocessors require a large number of input/output terminals to provide for connection with other electronic devices. Improving the performance of integrated circuits requires reducing feature sizes. Besides allowing for an increase of operating speed due to reduced signal propagation delays, this makes it possible to increase the number of functional elements of the circuit in order to increase its functionality. This, however, entails the need for a greater number of input/output connections. Thus, the available space for one of these connections is reduced. In this context, it is advantageous to electrically connect an integrated circuit to a substrate by means of flip-chip techniques. In contrast to wire bonding, where flexible metal wires providing electrical connections to peripheral devices are fixed at the perimeter of the chip, flip-chip methods make it possible to utilize the whole area of the chip for making connections.

A schematic sketch of a flip-chip bonded integrated circuit is shown in FIG. 1. In flip-chip assembly, an integrated circuit 101 is connected to a substrate 102 by means of electrically conductive bumps 103, 104, 105 which are formed on bond pads 106, 107, 108 provided on a surface of the chip 101, which also comprises electronic components 109. On the substrate 102, bond pads 110, 111, 112 on locations corresponding to the locations of the bond pads 106, 107, 108 of the chip 101 are provided. The chip 101 is attached to the substrate 102 such that the bond pads 106, 107, 108 on chip 101 and bond pads 110, 111, 112 of the substrate face each other. The bumps 103, 104, 105 provide electrical and mechanical connection between the chip 101 and the substrate 102. The substrate 102 can be, for example, a circuit board, a carrier or a flex substrate. Techniques where bond pads are connected by means of bumps can also be used to directly connect stacked chips.

Reducing the size of bond pads and bumps results in an increase in the current density, i.e., the amperage per cross-sectional area of a current flowing through a bump increases. This increased current density increases the likelihood of electromigration occurring.

Electromigration is the current-induced transport of metal atoms in conductors. Electrons moving in an electrical field exchange momentum with the atoms. At high current densities, the momentum imparted to the atoms forms a net force which is high enough to propel atoms away from their sites in the crystal lattice. Consequently, metal atoms pile up in the direction of electron flow. Electromigration is known to depend on various factors, in particular, current density, temperature, temperature gradient and mechanical stress. If electromigration occurs in a bump which provides electrical contact between substrates, the shape of the bump is altered. In the course of time, the bump is destroyed and electrical contact between the substrates is lost.

FIGS. 2a–2b schematically show the degradation of a bump by electromigration. Bump 205 provides electrical and mechanical contact between bond pads 204, 206 being provided in a first substrate 201 and a second substrate 202 and being connected to electrical connections 203, 207. The shape of a newly-formed bump 205 (FIG. 2a) changes to a shape as shown in FIG. 2b as bump 205 is degraded by electromigration effects.

If the size of connections comprised of bumps and bond pads in semiconductor devices is to be further reduced, it is necessary to adapt the design of bumps and bond pads in order to avoid adverse consequences regarding the performance of the device due to electromigration effects.

In view of the above-mentioned problems, a need exists for techniques which allow investigation of electromigration effects in conductive connections.

SUMMARY OF THE INVENTION

The present invention is generally directed to special test structures where problems caused by electromigration effects can be observed under well-defined experimental conditions, independently of problems caused by other components of integrated circuits, and to systems for the investigation of electromigration effects comprising such test structures.

According to one illustrative embodiment of the present invention, a test structure for the testing of connected substrates comprises a first substrate and a second substrate. The first substrate comprises a plurality of electrically conductive first probe pads providing electrical contact to an external device, a plurality of electrically conductive first bond pads and a plurality of electrically conductive first probe lines. Each of these probe lines provides electrical contact between at least one of the plurality of first probe pads and at least one of the plurality of first bond pads. The second substrate comprises a plurality of electrically conductive second bond pads, an electrical connection providing electrical contact between at least two of the second bond pads, and a plurality of electrically conductive bumps. These bumps are formed on and electrically connected to the second bond pads. The second substrate is attached to the first substrate such that the plurality of first bond pads and the plurality of second bond pads face each other and the bumps provide electrical contact between the first and second bond pads.

According to another illustrative embodiment of the present invention, a test structure for the testing of connected substrates comprises a first substrate and a second substrate. The first substrate comprises an electrically conductive first probe pad providing electrical contact to an external device, a plurality of electrically conductive first bond pads, a first electrical connection providing electrical contact between the first bond pads, and an electrically conductive first probe line providing electrical contact between the first probe pad and one of the first electrical connection and at least one of the plurality of first bond pads. The second substrate comprises an electrically conductive second probe pad providing electrical contact to an external device, a plurality of electrically conductive second bond pads, and a second electrical connection providing electrical contact between the second bond pads. The second substrate further comprises an electrically conductive second probe line providing electrical contact between the second probe pad and one of the second electrical connection and at least one of the plurality of second bond pads. Additionally, the second substrate comprises a plurality of electrically conductive bumps being formed on and electrically connected to the second bond pads. The second substrate is attached to the first substrate such that the plurality of first bond pads and the plurality of second bond pads face each other, and the bumps provide electrical contact between the first and second bond pads.

According to yet another illustrative embodiment of the present invention, a test structure for the testing of connected substrates comprises a first substrate and a second substrate. The first substrate comprises an electrically conductive first probe pad providing electrical contact to an external device, an electrically conductive first bond pad and an electrically conductive first probe line providing electrical contact between the first probe pad and the first bond pad. The second substrate comprises an electrically conductive second probe pad providing electrical contact to an external device, an electrically conductive second bond pad, an electrically conductive second probe line providing electrical contact between the first probe pad and the second bond pad, and an electrically conductive bump being formed on and electrically connected to the second bond pad. The second substrate is attached to the first substrate such that the first bond pad and the second bond pad face each other, and the bump provides electrical contact between the first and second bond pad.

According to yet another illustrative embodiment of the present invention, a system for testing connected substrates comprises a test structure, a power source, a first conductor, a second conductor, an ammeter and a voltmeter. The test structure comprises a first substrate and a second substrate. The first substrate comprises a plurality of electrically conductive first probe pads providing electrical contact to an external device, a plurality of electrically conductive first bond pads, and a plurality of electrically conductive first probe lines. Each of these first probe lines provides electrical contact between a member of the plurality of first probe pads and a member of the plurality of first bond pads. The second substrate comprises a plurality of electrically conductive second bond pads, an electrical connection providing electrical contact between at least two of the second bond pads, a second probe pad providing electrical contact to an external device and a second probe line. The second probe line provides electrical contact between the second probe pad and one of the electrical connection and a member of the plurality of second bond pads. The second substrate further comprises a plurality of electrically conductive bumps being formed on and electrically connected to the second bond pads. The second substrate is attached to the first substrate such that the plurality of first bond pads and the plurality of second bond pads face each other and the bumps provide electrical contact between the first and second bond pads. The first conductor provides electrical contact between the power source and one of the first probe pads. The second conductor provides electrical contact between the power source and the second probe pad. The ammeter is adapted to measure an amperage of a current generated by the power source. The voltmeter is adapted to measure a potential difference between the second probe pad and one of the first probe pads.

According to yet another illustrative embodiment of the present invention, a system for testing connected substrates comprises a test structure, a power source, a pair of conductors, an ammeter and a voltmeter. The test structure comprises a first substrate and a second substrate. The first substrate comprises a plurality of electrically conductive first probe pads providing electrical contact to an external device, a plurality of electrically conductive first bond pads, and a plurality of first electrical connections. Each of these first electrical connections provides electrical contact between a pair of the first bond pads, each bond pad being contacted by at most one of the first electrical connections. The first substrate further comprises a plurality of electrically conductive first probe lines. Each of these first probe lines provides electrical contact between a member of the plurality of first probe pads and a member of the plurality of first bond pads. The second substrate comprises a plurality of electrically conductive second bond pads, and a plurality of second electrical connections. Each of these second electrical connections provides electrical contact between a pair of the second bond pads, each bond pad being contacted by at most one of the second electrical connections. The second substrate further comprises a plurality of electrically conductive bumps being formed on and electrically connected to the second bond pads. The second substrate is attached to the first substrate such that the plurality of first bond pads and the plurality of second bond pads face each other, and the bumps provide electrical contact between the first and second bond pads. The bumps, the first and second bond pads and the first and second electrical connections form a contiguous electrically conductive path. The pair of conductors provides electrical contact between the power source and a first pair of first probe pads. The power source generates an electrical current in the contiguous electrical path. The ammeter is adapted to measure an amperage of this generated current. The voltmeter is electrically connected to a second pair of first probe pads and is adapted to measure a potential difference between members of the second pair of first probe pads.

According to yet another illustrative embodiment of the present invention, a system for testing connected substrates comprises a test structure, a power source and an ammeter. The test structure comprises a first substrate and a second substrate. The first substrate comprises an electrically conductive first probe pad providing electrical contact to an external device, a plurality of electrically conductive first bond pads, a first electrical connection providing electrical contact between the first bond pads and an electrically conductive first probe line. This probe line provides electrical contact between the first probe pad and one of the first electrical connections and a member of the plurality of first bond pads. The second substrate comprises an electrically conductive second probe pad providing electrical contact to an external device, a plurality of electrically conductive second bond pads, a second electrical connection providing electrical contact between the second bond pads, and an electrically conductive second probe line. This probe line provides electrical contact between the second probe pad and one of the second electrical connection and a member of the plurality of second bond pads. The second substrate further comprises a plurality of electrical conductive bumps being formed on and electrically connected to the second bond pads. The second substrate is attached to the first substrate such that the plurality of first bond pads and the plurality of second bond pads face each other and the bumps provide electrical contact between the first and second bond pads. The power source is adapted to generate a predetermined potential difference between the first probe pad and the second probe pad. The ammeter is adapted to measure an amperage of a current induced by this predetermined potential difference.

According to yet another illustrative embodiment of the present invention, a system for testing connected substrates comprises a test structure, a power source, a first conductor, a second conductor, an ammeter and a voltmeter. The test structure comprises a first substrate and a second substrate. The first substrate comprises an electrically conductive first probe pad providing electrical contact to an external device, an electrically conductive first bond pad and an electrically conductive first probe line providing electrical contact between the first probe pad and the first bond pad. The second substrate comprises an electrically conductive second probe pad providing electrical contact to an external device, an electrically conductive second band pad, an electrically conductive second probe line providing electrical contact between the second probe pad and the second bond pad, and an electrically conductive bump being formed on and electrically connected to the second bond pad. The second substrate is attached to the first substrate such that the first bond pad and the second bond pad face each other, and the bump provides electrical contact between the first and second bond pad. The first conductor provides an electrical contact between the power source and the first probe pad. The second conductor provides an electrical contact between the power source and the second probe pad. The ammeter is adapted to measure an amperage of a current generated by the power source. The voltmeter is adapted to measure a potential difference between the first probe pad and the second probe pad.

According to yet another illustrative embodiment of the present invention, a method for the fabrication of a test structure for the testing of connected substrates comprises forming a first component, forming a second component and attaching the second component to the first component. The formation of the first component comprises providing a first substrate, forming a plurality of electrically conductive first bond pads over the first substrate, forming a plurality of electrically conductive first probe pads over the first substrate and forming a plurality of first electrical connections over the first substrate. These first electrical connections provide electrical contact between pairs of first bond pads, each bond pad being contacted by at most one of the first electrical connections. The formation of the first component further comprises forming a plurality of electrically conductive first probe lines over the first substrate, each of these first probe lines providing electrical contact between a member of the plurality of first probe pads and one of a member of the plurality of first bond pads and a member of the plurality of first electrical connections. The formation of the second component comprises providing a second substrate, forming a plurality of electrically conductive second bond pads over the second substrate and forming a plurality of second electrical connections over the second substrate. The second electrical connections provide electrical contact between pairs of second bond pads, each bond pad being contacted by at most one electrical connection. The attaching of the second component to the first component comprises forming an electrically conductive bump over each of the second bond pads, aligning the first component and the second component such that the first bond pads and the second bond pads face each other, and connecting the bumps and the first bond pads.

BRIEF DESCRIPTION OF THE DRAWINGS

The invention may be understood by reference to the following description taken in conjunction with the accompanying drawings, in which like reference numerals identify like elements, and in which:

FIG. 3b shows a top view of the test structure as shown in FIG. 3a;

Figure 1:
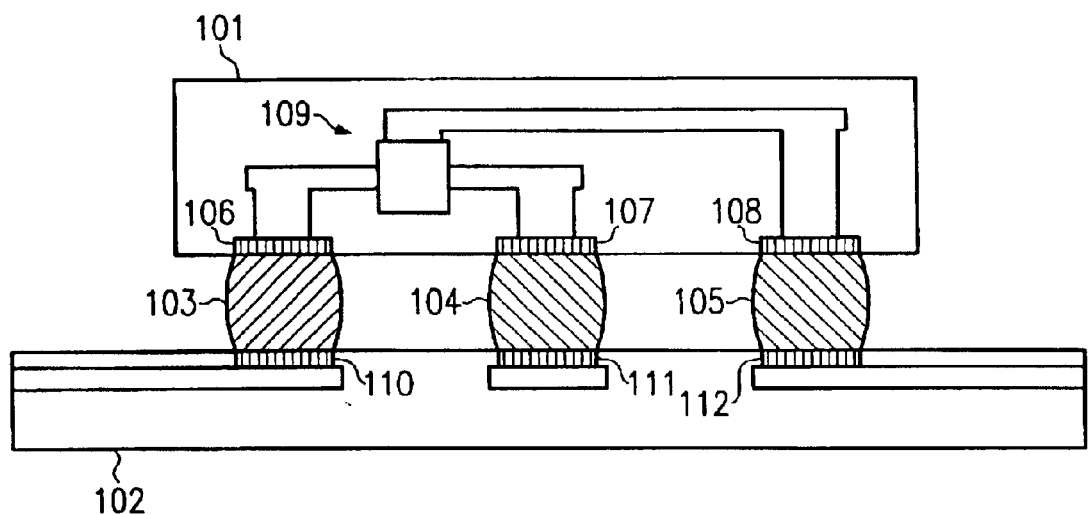
FIG. 1 shows a schematic cross-sectional view of an integrated circuit being flip-chip bonded to a substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention allows the testing of bump connections under predefined conditions. To this end, a test structure may comprise a first substrate and a second substrate. Both substrates comprise bond pads being provided for flip-chip connecting both substrates. The bond pads may have electrical contact to other bond pads and/or special probe pads which are provided for making electrical connections to external devices, such as a power supply, a measurement device sensitive to, e.g., voltage and/or current and/or resistance and/or temperature, and the like. Electrically conductive bumps are formed at least on the bond pads of one of the substrates. The substrates are aligned such that some of the bond pads on the first substrate face at least some of the bond pads on the second substrate, and electrical connection between respective bond pads on both substrates is provided by the bumps.

By connecting at least two of the probe pads with an external power source, a current can be generated which flows through at least one of the bumps. Measurement devices may be connected to the test structure for determining, for instance, the amperage of a current generated by the power source and for measuring potential differences between probe pads. This allows an estimation of the resistivity of bumps or groups of bumps. Since the degradation of a bump caused by electromigration effects may lead to an increase of its resistivity, measurements of resistivities of bumps can be used to monitor the degradation process.

Tests of this kind may be performed under conditions which enhance electromigration effects, e.g., elevated temperature or the presence of a temperature gradient. Moreover, the test structure enables the investigation of electromagnetic properties with respect to the shrinkage of feature sizes and/or different manufacturing schemes, varying operating and environmental conditions, and the like, so that bump structures of current and future IC generations may conveniently be optimized.

Figure 3A:
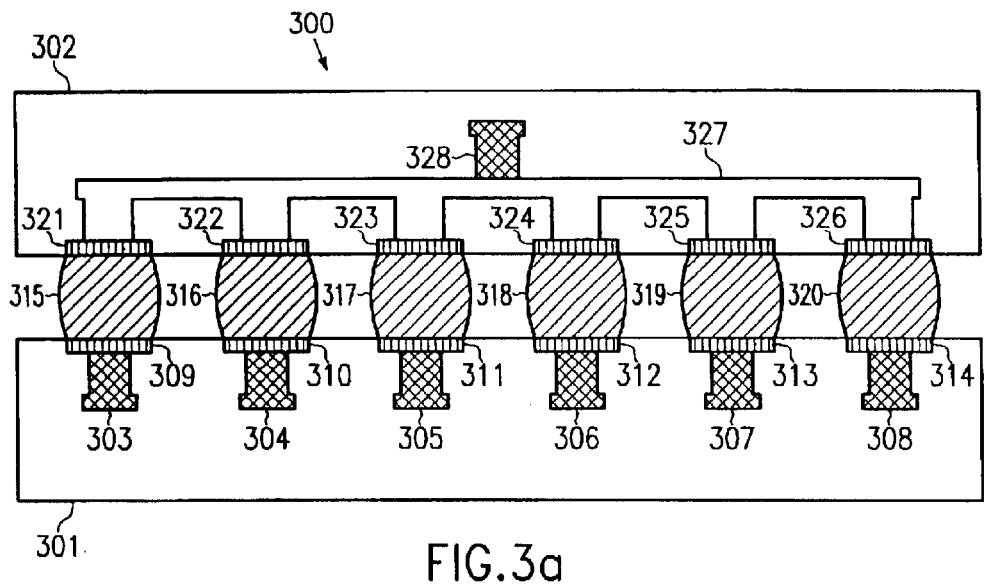
FIG. 3a shows a schematic cross-sectional view of a test structure according to an illustrative embodiment of the present invention.
Figure 3B:
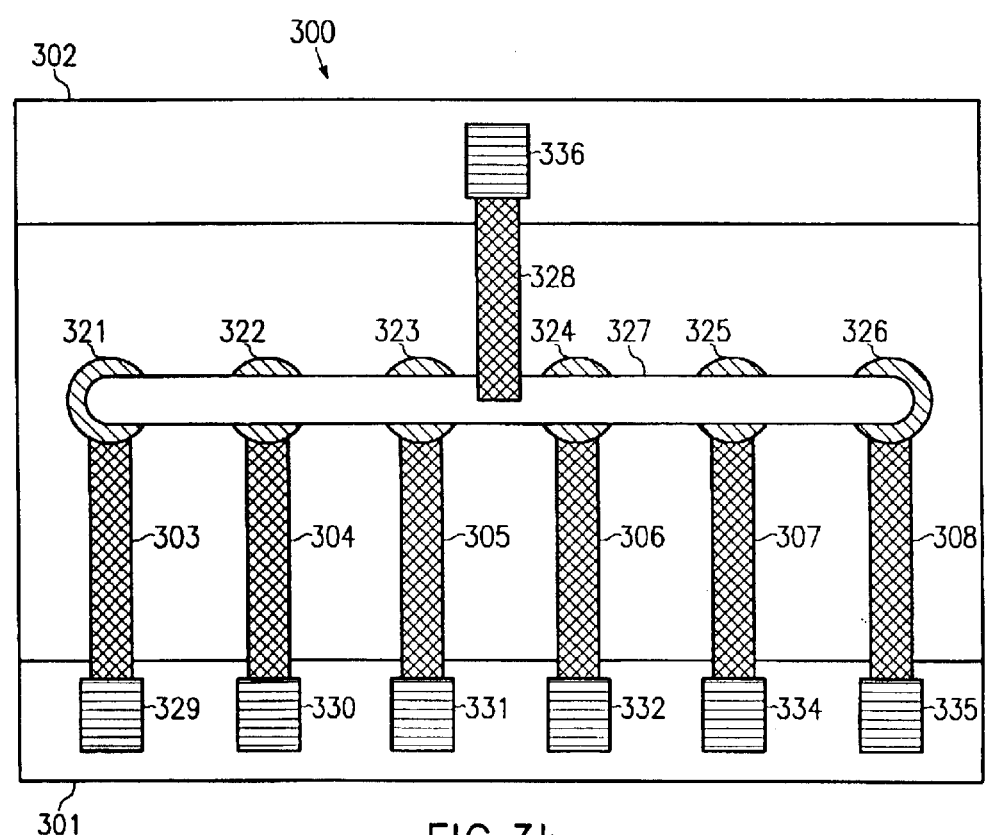

Further illustrative embodiments of the present invention will now be described with reference to FIGS. 3a–6. FIG. 3a shows a schematic cross-sectional view of a test structure 300 according to an illustrative embodiment of the present invention. A top view of the same structure is shown in FIG. 3b. A first substrate 301 comprises a plurality of electrically conductive probe pads 329, 330, 331, 332, 333, 334, 335. A plurality of bond pads 309, 310, 311, 312, 313, 314 is formed on the surface or near to the surface of the first substrate 301. The probe pads 329–335 and bond pads 309–314 are electrically connected via probe lines 303, 304, 305, 306, 307, 308. A second substrate 302 comprises a plurality of bond pads 321, 322, 323, 324, 325, 326. An electrical connection 327 provides electrical contact between the bond pads 321–326.

In a further illustrative embodiment of the present invention, the test structure 300 additionally comprises a probe pad 336 and a probe line 328 being provided in the second substrate 302. The probe line 328 makes electrical contact between the electrical connection 327 and the probe pad 336.

The bond pads 309–314 and bumps 315–320 do not need to be arranged in a row as shown in FIG. 3a. In other embodiments, they can be distributed over the whole area of the structure 300. The same is true for the other embodiments of the present invention described later.

In one particular embodiment, the first and the second substrate 301, 302 may have a design which is similar to that of components used in the fabrication of electronic devices. For example, if the stability of flip-chip connections between an integrated circuit and a circuit board with respect to electromigration is to be tested, one of the substrates, for example, the second substrate 302, may have a chip-like structure, while the other has a structure which closely resembles that of a circuit board.

In this example, the chip-like substrate 302 can be made using techniques which are also used in the fabrication of integrated circuits. Thus, the following process steps may be involved in fabricating the substrate 302. First, a semiconductor substrate covered with an oxide layer is provided. Then, metal lines are formed on the substrate. In the completed substrate, each of these metal lines will be a part of the probe line 328 or the electrical connection 327 between bond pads. Subsequently, the substrate is covered with a layer of electrically insulating material. Via holes are etched into this layer which are filled with metal. These via holes are above the metal lines and are provided to electrically connect the metal lines with bond pads 321–326 and/or the probe pad 336 formed above the via holes. The formation of these structural elements may be performed using photolithographic techniques. The board-like substrate may, for example, be a printed circuit board whose surface comprises a metal layer which has been etched to form bond pads, probe lines and/or electrical connections between bond pads and probe pads.

The test structure 300 is then completed by flip-chip bonding the chip-like substrate 302 to the board-like substrate 301. Any of the known flip-chip processes may be used for this purpose. Examples include solder bumping processes, plated bump flip-chip, gold stud bump flip-chip and adhesive flip-chip. The bumps 315–320 are formed on the substrate 302 and flip-chip bonding is performed by making connection between the bumps 315–320 and the other substrate 301. In the final stage of assembly, a space between the substrates 301, 302 which is provided by the bumps acting as spacers may be filled with a non-conductive underfill adhesive. In other embodiments, it may be desired to test the stability of bump connections between stacked chips. In this case, both substrates 301, 302 may have a chip-like structure.

If the second substrate 302 of the embodiments shown in FIGS. 3a–3b is a chip-like substrate, electrical connection 327 between the bond pads 321–326 can be made by forming a layer of electrically conductive material which covers a large portion of the area of the second substrate 302 instead of metal lines. Bond pads 321–326 can be formed on a layer of non-conductive material on top of this metal layer. Electrical contact between the metal layer and the bond pads may be provided by via holes filled with electrically conductive material.

Probe pads 329–336 are provided to electrically connect the test structure with external devices. Typically, probe pads 329–336 comprise a layer of electrically conductive metal, such as aluminum or copper. Electrical contact to the probe pads 329–336 can be made by bonding thin metal wires (made, for example, of gold) to the probe pads 329–336. For this to be done, probe pads in the first substrate should not be covered by the second substrate and vice versa.

If only the first substrate 301 comprises probe pads, access to these pads 329–335 can be made possible by using a second substrate 302 which is smaller than the first substrate 301 and arranging the probe pads 329–335 in a part of the first substrate 301 which is not covered by the second substrate 302.

If both substrates 301, 302 comprise probe pads, access to the probe pads can be made possible by using two substrates of equal width which are arranged such that on either side one of the substrates 301, 302 overhangs, as shown in FIG. 3*b*. In both substrates 301, 302, probe pads 329–336 are provided in the overhanging part of the substrate.

In alternative embodiments, probe pads may be formed on the back side of a substrate, while the bond pads are formed on the front side. In this case, the probe lines should comprise a through-hole filled with an electrically conductive material for providing electrical contact between structures on both sides of the substrate.

The completed substrate can be packaged into any kind of housing for integrated circuits known to a person skilled in the art.

Figure 4:
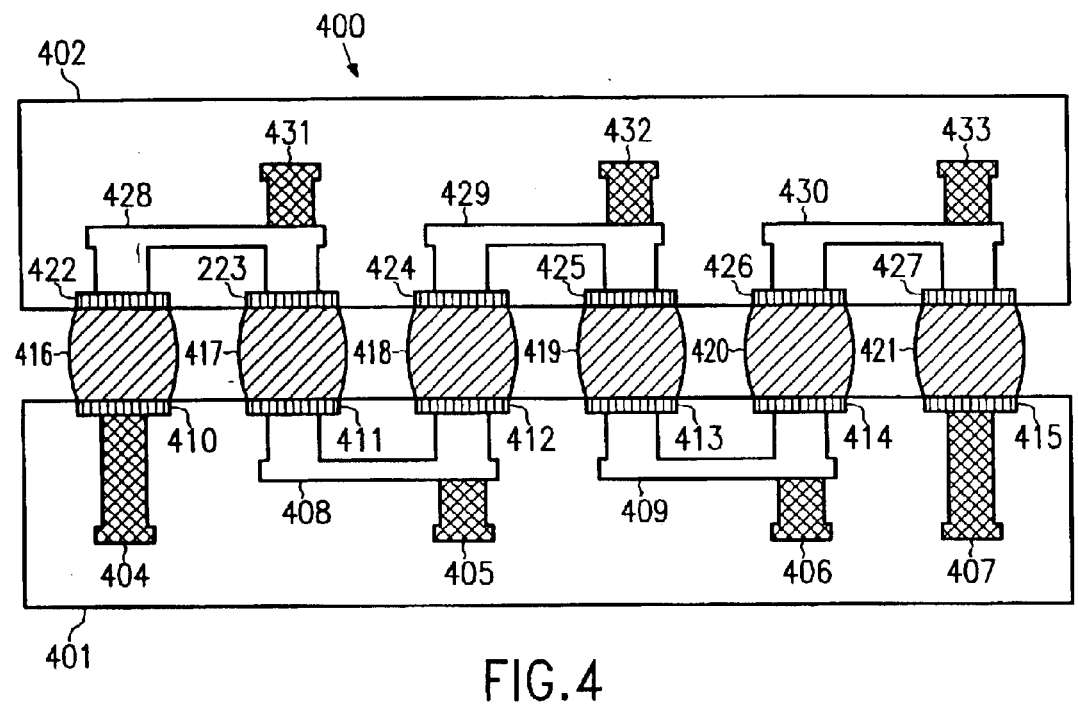
FIG. 4 shows a schematic cross-sectional view of a test structure according to another illustrative embodiment of the present invention.

FIG. 4 shows a schematic cross-sectional view of a test structure in conformity with another illustrative embodiment of the present invention. A first substrate 401 comprises a plurality of electrically conductive bond pads 410, 411, 412, 413, 414, 415 which are formed on or close to its surface. There is a plurality of electrical connections 408, 409. Each of these connections 408, 409 provides electrical contact between a pair of bond pads. Additionally, there are electrically conductive probe lines 404, 405, 406, 407. Each of these probe lines 404–407 provides electrical contact between a probe pad (not shown) and either a bond pad 410–415 or an electrical connection 408, 409. A second substrate 402 comprises a plurality of bond pads 422, 423, 424, 425, 426, 427 and a plurality of electrical connections 428, 429, 430. Each of these connections 428–430 provides electrical contact between a pair of bond pads.

The second substrate 402 is flip-chip bonded to the first substrate 401. Bumps 416, 417, 418, 419, 410, 421 are formed on the bond pads 410–415, 422–427 of one of the substrates 401, 402. The substrates 401, 402 are aligned such that the bond pads on both substrates face each other and the bumps 416–421 and the bond pads on the other substrate are connected.

In a further embodiment of the present invention, the second substrate further comprises electrically conductive probe lines 431, 432, 433, each of which provides electrical contact between one of the electrical connections 428, 429, 430 and a probe pad (not shown). Alternatively, some or all of the probe lines 431, 432, 433 in the second substrate may be connected to bond pads instead of electrical connections. Similar to the test structure shown in FIGS. 3*a*–3*b*, both substrates may have either a chip-like or a board-like structure.

In the test structure 400 shown in FIG. 4, bond pads 410–415, 422–427, bumps 416–421, and the electrical connections 408, 409, 428, 429, 430 form a contiguous electrical path. This contiguous electrical path extends from bond pad 410 to bond pad 415.

The manufacturing process of a test structure 400 according to an embodiment of the present invention without probe lines 431, 432, 433 in the second substrate 402 can be simplified if either both substrates have a chip-like structure or both substrates 401, 402 have a board-like structure. First, two substantially identical substrates 401, 402 are formed. Each comprises bond pads, electrical connections between bond pads, probe pads and probe lines between probe pads and bond pads and/or between probe pads and electrical connections. The bond pads on both substrates are arranged such that bond pads 410–415 on the first substrate 401 and bond pads 422–427 on the second substrate 402 face each other if both substrates 401, 402 are laid one upon the other.

An area of the second substrate which comprises the probe pads 402 is removed before bumps 416–421 are formed on the bond pads 410–415 or the bond pads 422–427 and both substrates are flip-chip bonded. In this manufacturing process, one set of masks used for photolithographic processes can be used for the fabrication of both substrates 401, 402.

Figure 5:
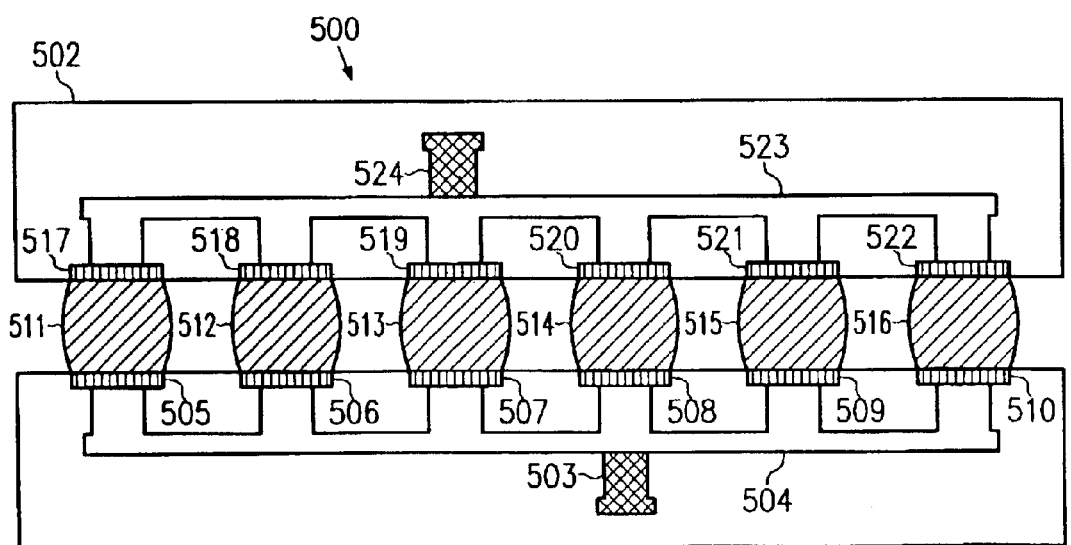
FIG. 5 shows a schematic cross-sectional view of a test structure according to yet another illustrative embodiment of the present invention.

FIG. 5 shows a schematic cross-sectional view of a test structure 500 in conformity with a further embodiment of the present invention. A first substrate 501 comprises bond pads 505, 506, 507, 508, 509, 510 and an electrical connection 504 which provides electrical contact between all of the bond pads 505–510. A probe line 503 connects the electrical connection 504 with a probe pad (not shown). A second substrate 502 comprises bond pads 517, 518, 519, 520, 521, 522, an electrical connection 523, which provides electrical connection between all of the bond pads 517–522, and a probe line 524 providing electrical contact to a probe pad (not shown) similar to the first substrate 501. Electrical and mechanical connection between both substrates is provided by a plurality of bumps 511, 512, 513, 514, 515, 516.

Figure 6:
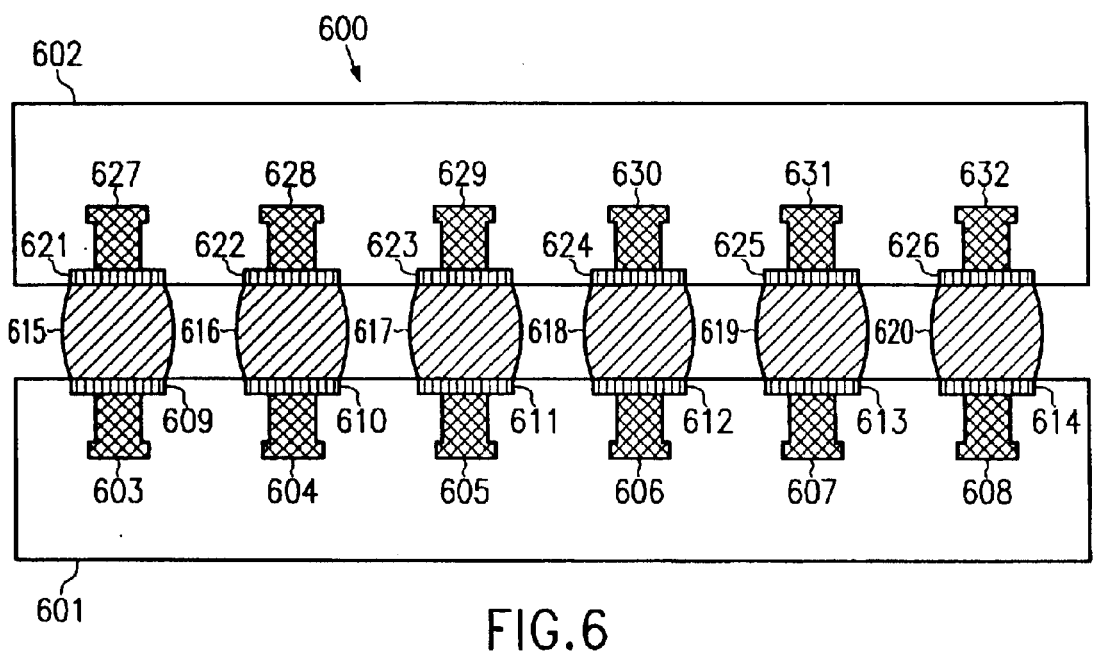
FIG. 6 shows a schematic cross-sectional view of a test structure according to yet another illustrative embodiment of the present invention.

FIG. 6 shows a schematic cross-sectional view of a test structure 600 in conformity with a further illustrative embodiment of the present invention. A first substrate 601 comprises bond pads 609, 610, 611, 612, 613, 614. Each bond pad is connected to a probe pad (not shown) via one of a plurality of probe lines 603, 604, 605, 606, 607, 608. A second substrate 602 also comprises bond pads 621, 622, 623, 624, 625, 626 being connected to probe pads (not shown) via connection lines 627, 628, 629, 630, 631, 632. Both substrates 601, 602 are flip-chip bonded, electrical and mechanical contact between both substrates 601, 602 being provided by a plurality of bumps 615, 616, 617, 618, 619, 620.

Figure 7:
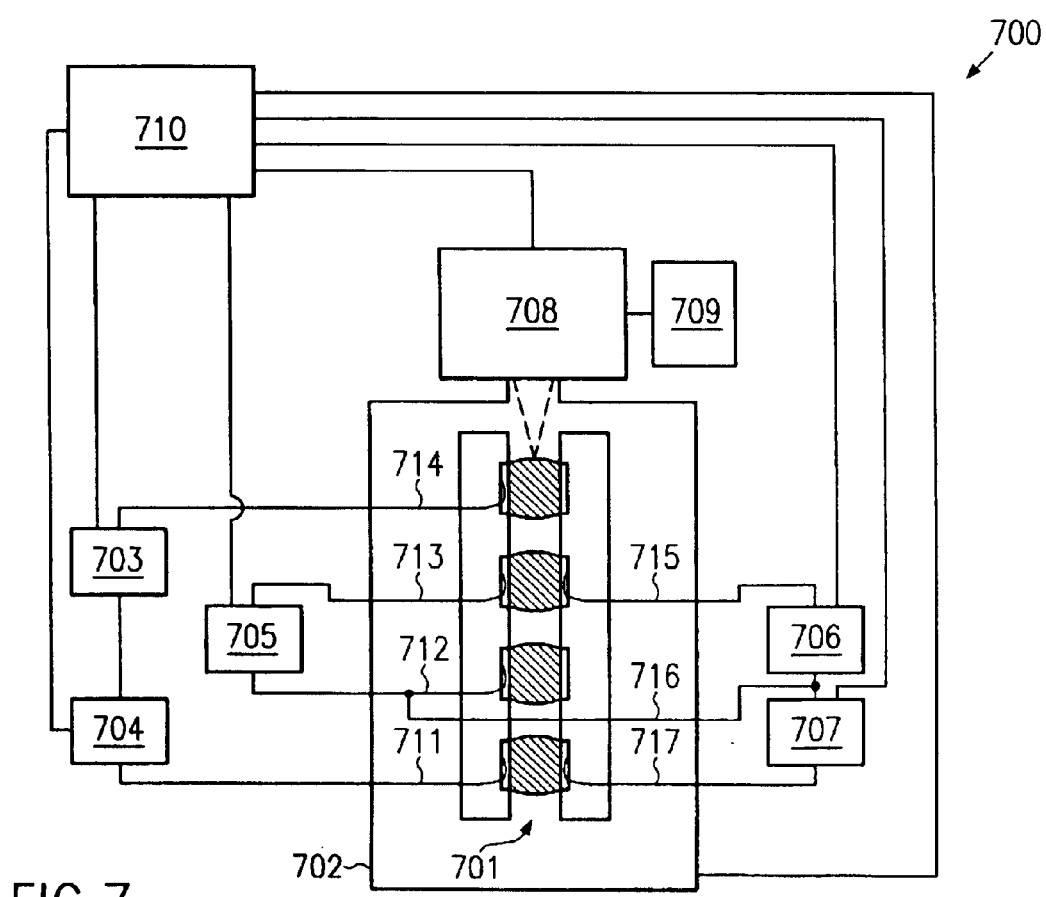
FIG. 7 shows a sketch of a system for testing connected substrates according to the present invention.

FIG. 7 shows a schematic view of a system 700 for the investigation of electromigration. The system comprises a test structure 701. This may have a composition in accordance with any of the embodiments of the present invention described above. Electrical contact to the test structure 701 is made by means of wires 711, 712, 713, 714, 715, 716, 717 which are connected to probe pads. At least two of these wires 711–717, e.g., wires 711, 714, connect the test structure 701 with a power source 703 which generates an electric current flowing through at least one of the bumps of the test structure 701. The power source 703 may be either a constant voltage power source or a constant current power source. The amperage of the current generated by the power source 703 is measured by an ammeter 704.

Voltmeters 705, 706, 707 are arranged to measure potential differences between probe pads of the test structure 701. The system 700 may also comprise an observation unit 708 which is arranged so as to allow observation of at least one of the bumps in the test structure 701. Images of the bumps are displayed on a monitor 709. The observation unit 708 may be a microscope, e.g., an optical microscope or a scanning electron microscope.

In most applications, integrated circuits are expected to work reliably for several years. Testing the stability of bumps for such a long time is economically unrealistic. Therefore, it is advantageous to perform the tests at elevated temperatures where electromigration is faster than at the normal operating temperature of an integrated circuit. To do so, the system advantageously comprises a temperature control unit 702 which makes it possible to adjust the temperature of the test structure to a predetermined value. Preferably, the temperature control unit comprises a furnace, the test structure being provided within the furnace.

The system may additionally comprise means for applying a temperature gradient to the test structure in order to simulate the behavior of an integrated circuit having contact to a cooling element from one side. Such means might be a heat source attached to a first substrate of the test structure 701 and/or a cooling element attached to a second substrate of the test structure 701.

Finally, the system 700 may comprise a computer 710 which controls at least one of the power source 703, the temperature control unit 702, the observation unit 708 and the means for applying a temperature gradient to the test structure. The computer 710 may be adapted to receive values measured by the ammeter 704 and voltmeters 705, 706, 707. Additionally, it may be adapted to receive images taken by the observation unit 708. The computer 710 may further comprise a program for automatically performing a complete test process.

In a system for investigating electromigration using a test structure 300, as described with reference to FIGS. 3a–3b, the power source 703 is connected to probe pad 336 and one of probe pads 329–335. In the following, we assume that this is probe pad 329. Then, a current flows through an electrical path consisting of probe pad 336, probe line 328, electrical connection 327, bond pad 321, bump 315, bond pad 309, probe line 303 and probe pad 329. An ammeter 704 measures the amperage of this current. If a voltmeter is connected to probe pads 336 and 329, the ratio of the measured potential difference between the probe pads and the measured amperage of the current equals the sum of the resistivities of all circuit elements in the electrical path. If any of the circuit elements, in particular bump 315, is degraded by electromigration effects, the determined resistivity of the current path increases. If bump 315 is destroyed, the electrical path is interrupted and the current is turned off. Thus, the degradation and destruction of circuit elements in the test structure can be monitored.

Investigations of the behavior of several bumps in the test structure 300 can be performed simultaneously. To this end, a plurality of power sources is provided. Each is connected to probe pad 336 and one of probe pads 329–335. Ammeters measure the amperages of currents generated by the power sources. Voltmeters determine potential differences between probe pad 336 and probe pads 329–335. Thus, the resistivities of various electrical paths in the test structure which comprise bumps 315–320 can be determined simultaneously.

In a system for the investigation of electromigration comprising a test structure 400 as described with reference to FIG. 4, the power source 703 is connected to a probe pad providing electrical contact to probe line 404 and to a probe pad providing electrical contact to probe line 407. Thus, a current flows through the probe lines 404, 407 and through the contiguous electrical path from bond pad 410 to bond pad 415 which comprises all the bumps 416–421 in the test structure 400. The ammeter 704 measures the amperage of this current. This setup is particularly suited for determining the stability of an extended circuit comprising a plurality of elements like bumps, bond pads and electrical connections with respect to electromigration. If any of the circuit elements in the contiguous electrical path is destroyed, the path is interrupted and the current breaks down.

In this setup, the bumps 416–421 are connected in series. If a voltmeter is connected to probe pads providing electrical contact to two of probe lines 404–407, the ratio of the measured potential difference between these probe pads and the amperage of the current flowing through the test structure 400 determined by the ammeter 704 equals the sum of the resistivities of a plurality of bumps plus a contribution from electrical connections between the bumps. For example, the potential difference between probe pads connected to probe lines 405, 406 depends on the resistivities of bumps 418, 419. If the second substrate 402 of the test structure 400 further comprises probe pads and probe lines 431–433, resistivities of individual bumps can be estimated. For example, the ratio of the potential difference between a probe pad connected to probe line 432 and a probe pad connected to probe line 406 and the amperage of the current flowing through the test structure 400 equals the resistivity of the bump 419 (plus a contribution from electrical connections 429, 409).

Figure 2A:
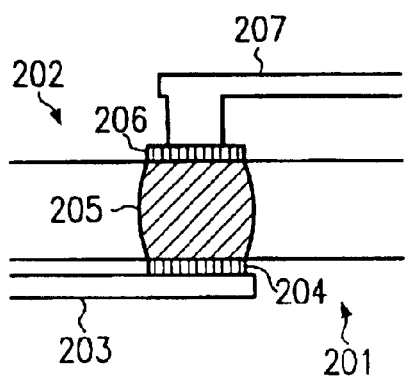
FIGS. 2a and 2b show a schematic cross-sectional view of a newly formed bump and a bump being degraded by electromigration effects, respectively.
Figure 2B:
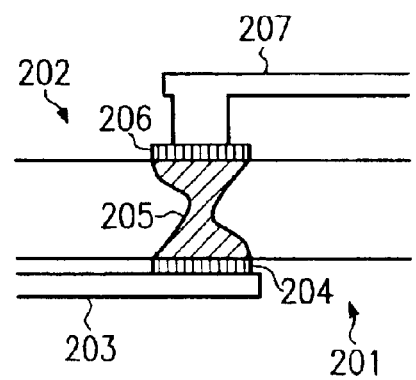

A system for the investigation of electromigration effects comprising a test structure 500 as described with reference to FIG. 5 is particularly suited for the detection of the destruction of individual bumps by electromigration effects. In such a system, a constant voltage power source is connected to the probe pad in the first substrate 501 and the probe pad in the second substrate 502, generating a predetermined potential difference between electrical connection 504 and electrical connection 523. Thus, the amperage of the current flowing through the test structure 500 equals the product of this potential difference and the sum of the conductivities of bumps 511–516. If one of the bumps 511–516 degrades due to electromigration effects, material is transported from one portion of the bump to another portion. Thus, a degraded bump will comprise a portion whose cross-section is smaller than that of a newly formed bump, as shown in FIGS. 2a–2b. Consequently, the local current density in this portion of the bump is greater than the current density in a newly formed bump. This accelerates electromigration effects. The self-enhancing nature of degradation may lead to a catastrophic destruction of the bump where the conductivity of the bump quickly drops to zero. Thus, the amperage of a current flowing through a plurality of bumps 511–516 connected in parallel decreases step-wise as bumps 511–516 are destroyed. Computer 710 may comprise means for detecting such steps, thus allowing for an automated measurement of lifetimes of individual bumps.

In a system for the investigation of electromigration effects comprising a test structure 600 as described with reference to FIG. 6, the power source 703 is connected to one of the probe pads in the first substrate 601 and to a probe pad in the second substrate 602 being electrically connected to one of the bumps 615–620. Thus, the resistivities of individual bumps can be measured. Using a plurality of power sources, ammeters and voltmeters, measurements of the resistivities of a plurality of bumps can be performed simultaneously.

It should be noted that further embodiments of the present invention may be particularly adapted for the investigation of bumps of different size and/or for the investigation of bumps formed of different materials and/or for the investigation of effects induced by a variation of size and material of other circuit elements, e.g., bond pads or electrical connections. Systems for the testing of connected substrates according to other embodiments of the present invention may comprise a radiation source for testing the stability of circuit elements in the presence of ionizing radiation and/or mechanical equipment for applying mechanical stress to the test structure and/or a humidifier for testing the stability of test structures in the presence of moisture and/or an over-pressure/vacuum source for examining the bump behavior for varying environmental conditions, such as different altitudes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A test structure for testing of connected substrates, said test structure comprising:
    a first substrate comprising:
        at least one electrically conductive first probe pad providing electrical contact to an external device;
        a plurality of electrically conductive first bond pads; and
        at least one electrically conductive first probe line that provides electrical contact between said at least one first probe pad and at least one of the plurality of first bond pads;
    a second substrate comprising:
        a plurality of electrically conductive second bond pads;
        an electrical connection providing electrical contact between at least two of said second bond pads; and
        a plurality of electrically conductive bumps being formed on and electrically connected to said second bond pads;
    said second substrate being attached to said first substrate, the plurality of first bond pads and the plurality of second bond pads facing each other, said bumps providing electrical contact between said first and second bond pads.

2. The test structure of claim 1, wherein said electrical connection comprises an electrically conductive metal layer.

3. The test structure of claim 1, wherein said electrical connection comprises an electrically conductive metal line.

4. The test structure of claim 1, wherein said at least one electrically conductive probe line comprises an electrically conductive metal line.

5. The test structure of claim 1, wherein said second substrate further comprises:
    a second probe pad providing electrical contact to an external device; and
    a second probe line providing electrical contact between said second probe pad and one of said electrical connection and at least one of the plurality of second bond pads.

6. The test structure of claim 1, wherein said first substrate further comprises:
    a plurality of first electrical connections, each providing electrical contact between a pair of said first bond pads, each bond pad being contacted by at most one of said first electrical connections;
    wherein said second substrate comprises a plurality of second electrical connections including said electrical connection providing electrical contact between at least two of said second bond pads, each of said second electrical connections providing electrical contact between a pair of said second bond pads, each bond pad being contacted by at most one of said second electrical connections; and
    wherein said bumps, said first and second bond pads said first and second electrical connections form a contiguous electrically conductive path.

7. The test structure of claim 6, wherein each of said first electrical connections comprises an electrically conductive metal line.

8. The test structure of claim 6, wherein said second substrate further comprises:
    a plurality of electrically conductive second probe pads providing electrical contact to an external device; and
    a plurality of electrically conductive second probe lines, each of said second probe lines providing electrical contact between at least one of the plurality of second probe pads and one of a member of the plurality of second electrical connections and a member of the plurality of second bond pads.

9. The test structure of claim 8, wherein each of said second probe lines comprises an electrically conductive metal line.

* * * * *